US008233340B1

(12) United States Patent
Chingi Chang (10) Patent No.: US 8,233,340 B1
(45) Date of Patent: Jul. 31, 2012

(54) PROGRAMMABLE CONTROL BLOCK FOR DUAL PORT SRAM APPLICATION

(75) Inventor: Catherine Chingi Chang, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/044,032

(22) Filed: Mar. 9, 2011

Related U.S. Application Data

(63) Continuation of application No. 12/564,368, filed on Sep. 22, 2009, now Pat. No. 7,916,563, which is a continuation of application No. 11/836,639, filed on Aug. 9, 2007, now Pat. No. 7,613,055.

(51) Int. Cl.
*G11C 7/00* (2006.01)
(52) U.S. Cl. .................. 365/194; 365/233.11
(58) Field of Classification Search ............... 365/194, 365/233.11
See application file for complete search history.

(56) References Cited

U.S. PATENT DOCUMENTS

| | | | |
|---|---|---|---|
| 5,459,851 A | 10/1995 | Nakajima et al. | |
| 6,167,487 A | 12/2000 | Camacho et al. | |
| 6,191,998 B1 | 2/2001 | Reddy et al. | |
| 6,249,471 B1 | 6/2001 | Roy | |
| 6,525,988 B2 | 2/2003 | Ryu et al. | |
| 6,882,562 B2 | 4/2005 | Beucler | |
| 7,110,304 B1 | 9/2006 | Yu et al. | |
| 7,130,238 B1 | 10/2006 | Yu et al. | |
| 7,414,916 B1 | 8/2008 | Yu et al. | |
| 7,420,860 B2 | 9/2008 | Yamada et al. | |
| 7,477,561 B2 | 1/2009 | Hirabayashi | |
| 7,613,055 B2 | 11/2009 | Chang | |
| 7,834,615 B2 * | 11/2010 | Jarboe et al. ............... 324/750.3 | |
| 2002/0078311 A1 | 6/2002 | Matsuzaki et al. | |

FOREIGN PATENT DOCUMENTS

CN 101364432 2/2009

OTHER PUBLICATIONS

Non-Final Office Action for U.S. Appl. No. 11/668,347, mailed on Mar. 16, 2009, 10 pages.
Final Office Action for U.S. Appl. No. 11/668,347, mailed on Nov. 13, 2009, 11 pages.
Advisory Action for U.S. Appl. No. 11/668,347, mailed on Mar. 17, 2010, 3 pages.
Notice of Allowance for U.S. Appl. No. 11/836,639, mailed on Jun. 23, 2009, 9 pages.
U.S. Appl. No. 11/668,347, filed Jan. 29, 2007, Chou.
U.S. Appl. No. 11/897,610, filed Jul. 31, 2007, Chang.

* cited by examiner

*Primary Examiner* — Son Dinh
*Assistant Examiner* — Nam Nguyen
(74) *Attorney, Agent, or Firm* — Ropes & Gray LLP (57) ABSTRACT

A dual-port static random access memory (SRAM) includes a multitude of programmable delay elements disposed along the paths of a number signals used to carry out read, write or read-then-write operations. At least one of the programmable delay elements controls the timing margin between a pair of clock signals that trigger a read/write enable signal. A second programmable delay element coarsely adjusts the delay of a first signal associated with a dummy bitline. A third programmable delay element finely adjusts the delay of a second signal associated with the dummy bitline. A fourth programmable delay element controls the delay of a signal used to reset the read/write enable signal. During a read operation, the voltage level of the second signal is used as an indicator to activate the sense amplifiers. During a write operation, the voltage level of the second signal is used to control the write cycle.

20 Claims, 6 Drawing Sheets

PROGRAMMABLE CONTROL BLOCK FOR DUAL PORT SRAM APPLICATION

CROSS-REFERENCE TO RELATED APPLICATIONS

This application is a continuation of, and claims the benefit of and priority to, U.S. patent application Ser. No. 12/564,368, filed Sep. 22, 2009, which is continuation of, and claims the benefit of and priority to, U.S. patent application Ser. No. 11/836,639, filed Aug. 9, 2007 (now U.S. Pat. No. 7,613,055, issued Nov. 3, 2009), each of which is hereby incorporated by reference in its respective entirety.

BACKGROUND OF THE INVENTION

The present invention relates to Integrated Circuits (IC), and more particularly to controlling the timing of signals used in a memory embedded in an IC.

Advances in semiconductor fabrication processes which have enabled an ever increasing number of transistors to be formed on an IC fabricated on a single semiconductor substrate, have seen a parallel increase in the type and number of functions that such ICs may perform. One class of ICs enables its users to program functions that the IC is required to perform. This class comprises programmable ICs such as programmable logic devices (PLDs), field programmable gate arrays (FPGAs), microprocessors, coprocessors, microcontrollers, programmable controllers or sequencers, graphics controllers, memories, DRAMs, SRAMs, EPROMs, serial EPROMs, Flash memories, and many others.

The various hardware blocks, commonly known as logic array blocks, are typically not connected to one another when the FPGA is first supplied by its manufacturer. The user must first program the FPGA to carry out the functions specified by the user. Programming of an FPGA is usually performed with the aid of software in which the interconnections between various logic blocks are first specified. After being executed, the software causes the specified interconnections to occur, in other words, it programs the FPGA to create the desired logic and interconnections. An FPGA thus eliminates the need for design-intensive and time-consuming efforts required for custom-specific ICs.

An FPGA usually includes arrays of logic blocks that are programmable and are selectively connected to arrays of interconnect lines to attain both combinatorial as well as sequential logic functions. Programming of programmable logic blocks, as well as their connections to the selected lines (e.g., bus lines), is typically achieved by establishing the states of a multitude of programmable elements, such as configuration cells or fuses, disposed in the FPGA.

Figure 1:
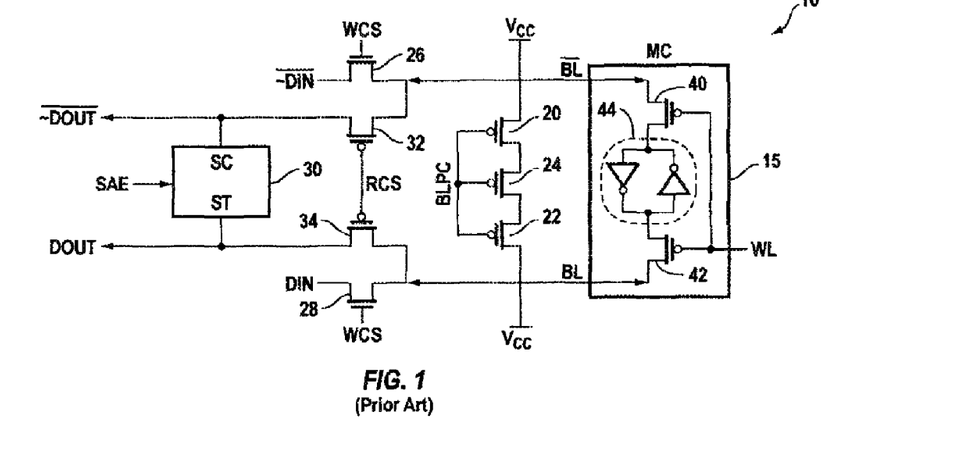
FIG. 1 is a schematic diagram of a section of read and write paths associated with a single port SRAM cell, as known in the prior art.

An FPGA typically includes, in addition to various other blocks, an array of static random access memory (SRAM) cells. The SRAM array may have a single port, used for both read and write operations, or a dual port with one port dedicated to read and another port dedicated to write operations, or with both ports implementing the read/write functions in parallel. FIG. 1 is a schematic diagram of a section of a single port read and write paths associated with SRAM cell 15. P-channel transistors 20, 22 and 24 precharge the true and complementary bitlines BL and $\overline{BL}$ to supply voltage Vcc prior to read and/or write operations. During a read operation, bitlines BL and $\overline{BL}$ are coupled to the sense amplifier 30 via transistors 32 and 34 and in response to read column select signal RCS. The sensed data are supplied as signals DOUT and $\overline{DOUT}$. During a write operation, input data supplied using signals DIN and $\overline{DIN}$ are transferred to bitlines BL and $\overline{BL}$ via transistors 26 and 28 and in response to write column select signal WCS.

Figure 2:
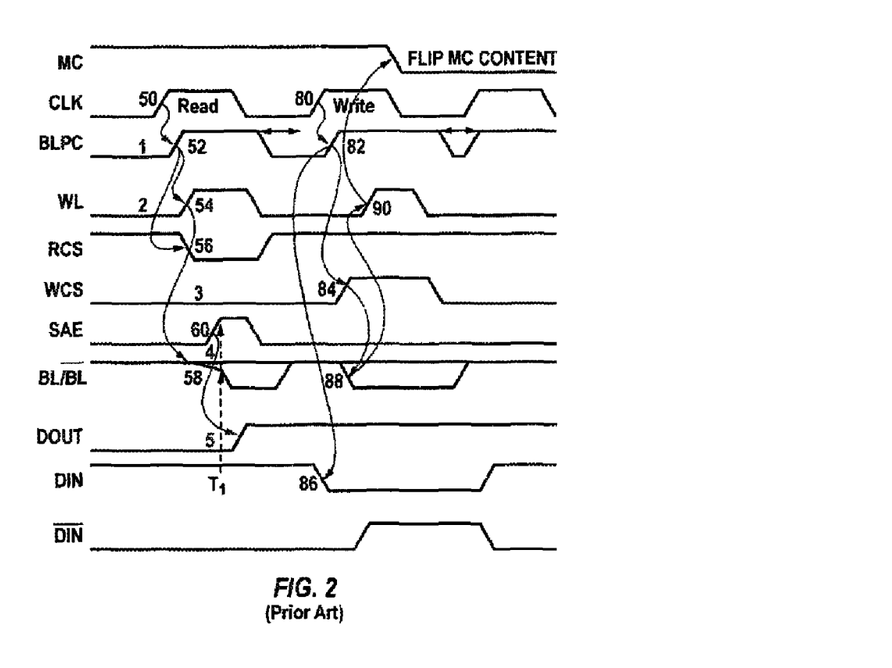
FIG. 2 is a timing diagram of the signals used during read and write operations of the SRAM cell of FIG. 1, as known in the prior art.

FIG. 2 is a timing diagram of the signals used during read and write operations, as shown in FIG. 1. In response to a low-to-high transition 50 on clock signal CLK following a read request (not shown), signal BLPC makes a high-to-low transition 52, signal WL makes a low-to-high transition 54, and signal RCS makes a high-to-low transition 56. Transition 52 of signal BLPC terminates the bitline precharge operation. Transition 54 of signal WL turns on transistors 42 and 44 to enable inverter pair 44 of SRAM cell 15 to be coupled to bitlines BL and $\overline{BL}$ thus enabling these bitlines to develop voltage differentials 58. At time T1, the voltage differentials on bitlines BL and $\overline{BL}$, and corresponding dummy bitlines (not shown) reach a value that cause sense amp 30 to be enabled via transition 60 of signal SAE. Thereafter, sense amp 30, sensing the voltage differentials on bitlines BL and $\overline{BL}$, generates output data signal DOUT. Following the completion of the read operation, the various signals described above are restored to their previous values.

In response to a low-to-high transition 80 on clock signal CLK following a write request (not shown), signal BLPC makes a high-to-low transition 82 thus terminating the bitline precharge operation. Transition 82 also causes signal WSC to make a low-to-high transition 84 to couple the bitlines BL and $\overline{BL}$ to the data input lines DIN and $\overline{DIN}$ in order to enable the new data to be stored in cell 15. Accordingly, after transition 84, bitlines BL and $\overline{BL}$ transition to their new complementary values, shown using transition 88, reflecting the new low value 86 of input data DIN. Thereafter, signal WL makes a low-to-high transition 90 to enable inverter pair 44 of cell 15 to be coupled to the bitlines carrying the new data, as represented by transition 92 on signal MC, representing the memory content. Following the completion of the write operation, the various signals described above are restored to their previous values, as seen in FIG. 2.

As is well known, successful completion of read and write operations in a dual-port SRAM embedded in an FPGA requires maintaining accurate timing margins between a number of critical signals. For example, to perform a successful read operation, bitline precharge signal BLPC must be turned off before the wordline select signal WL is asserted so as to allow a bitline voltage differential to develop before the sense amps are activated. Similarly, to perform a successful write operation, bitline precharge signal BLPC must be turned off before the write column select signal WCS is asserted to supply the new input data to the bit lines. Such timing margins during the various memory operations must be maintained for all qualified process, temperature and voltage variations.

As the technology for manufacturing FPGAs scales down into deep sub-micron, partly due to local random variations, the mathematical models used to account for actual variations in fabrication processes may become less accurate As a result, the timing margins and performance metrics may be subject to degradation. The timing margin degradations may also result in functional failure.

BRIEF SUMMARY OF THE INVENTION

In accordance with one embodiment of the present invention, a dumpy path is used to generate all critical signals used to control a dual-port static random access memory (SRAM) embedded in a programmable IC. To achieve this, the dual-port static random access memory (SRAM) embedded in a programmable IC includes a multitude of programmable delay elements disposed along the paths of a number signals used to control the timing associated with read, write or read-then-write operations. At least one of the programmable delay elements controls the timing margin between a pair of clock signals that trigger a read/write enable signal. The read/write enable signal is used, in turn, to trigger all memory access operations.

A pair of programmable delay elements is used to control the timing of signals associated with the dummy bitlines, with one of the programmable delay elements controlling coarse adjustment of the timings of these signals, and the other one controlling fine adjustment of the timings of these signals. A fourth programmable delay element controls the delay of a signal used to reset the read/write enable signal.

During a read operation, the voltage level of the dummy bit line is used as an indicator to activate the sense amplifiers. During a write operation, the voltage level of the dummy bit line is used as an indicator to determine the time when the addressed wordline is activated to connect the bitlines carrying the new data to the addressed memory cells.

DETAILED DESCRIPTION OF THE INVENTION

In accordance with one embodiment of the present invention, a dual-port static random access memory (SRAM) embedded in a programmable IC includes a multitude of programmable delay elements disposed along the critical paths of a number signals used to carry out read, write or read-then-write operations. The present invention will be described in the context of FPGAs, but it has application to other programmable ICs. At least one of the programmable delay elements controls the timing margin between a pair of clock signals that trigger a read/write enable signal. The read/write enable signal is used, in turn, to trigger all memory access operations. A pair of programmable delay elements is used to control the timing of signals associated with the dummy bitlines, with one of the programmable delay elements controlling coarse adjustment of the timings of these signals, and the other one controlling fine adjustment of the timings of these signals. A fourth programmable delay element controls the delay of a signal used to reset the read/write enable signal. During a read operation, the voltage level of the dummy bit line is used as an indicator to activate the sense amplifiers. During a write operation, the voltage level of the dummy bit line is used as an indicator to determine the time when the addressed wordline is activated to complete the write cycle.

Figure 3:
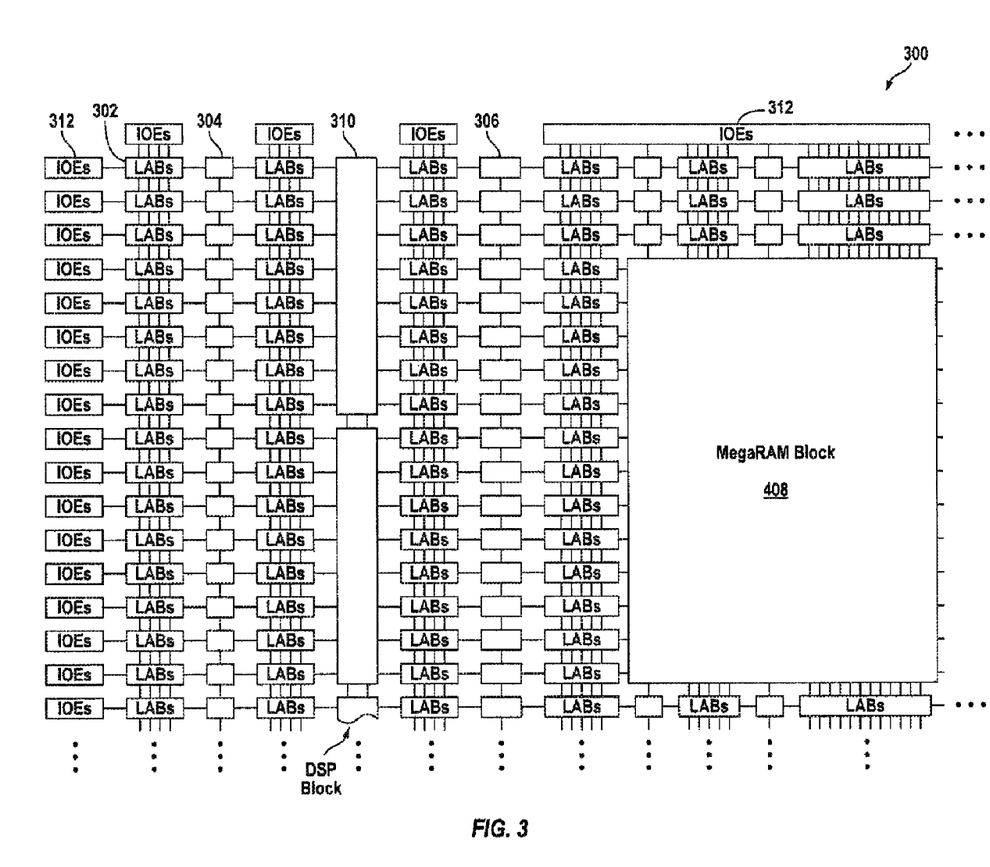
FIG. 3 is a simplified partial block diagram of an exemplary high-density programmable logic device adapted to include a dual-port SRAM, in accordance with one embodiment of the present invention

FIG. 3 is a simplified partial block diagram of an exemplary high-density programmable logic device (PLD) 300 adapted to include a dual-port SRAM, in accordance with one embodiment of the present invention. PLD 300 includes a two-dimensional array of programmable logic array blocks (or LABs) 302 that are interconnected by a network of column and row interconnections of varying length and speed. LABs 302 include multiple (e.g., 10) logic elements (or LEs), an LE being a small unit of logic that provides for efficient implementation of user defined logic functions.

PLD 300 also includes a distributed memory structure including RAM blocks of varying sizes provided throughout the array. The RAM blocks include, for example, 512 bit blocks 304, 4K blocks 306 and an M-Block 308 providing 512K bits of RAM. One or more of the RAM blocks may be dual-port SRAM blocks. These memory blocks may also include shift registers and FIFO buffers. PLD 300 further includes digital signal processing (DSP) block 310 that can implement, for example, multipliers with add or subtract features.

It is to be understood that PLD 300 is described herein for illustrative purposes only and that the present invention can be implemented in many different types of FPGA, PLDs, and other integrated circuits.

Figure 4:
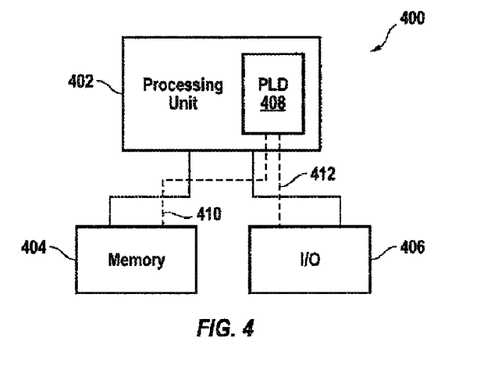
FIG. 4 is a block diagram of an exemplary digital system which may embody the present invention.

While PLDs of the type shown in FIG. 3 provide many of the resources required to implement system level solutions, the present invention can also provide benefit to systems in which a PLD is one of several components. FIG. 4 shows a block diagram of an exemplary digital system 400, within which the present invention may be embodied. System 400 can be a programmed digital computer system, digital signal processing system, specialized digital switching network, or other processing system. Moreover, such systems may be designed for a wide variety of applications such as telecommunications systems, automotive systems, control systems, consumer electronics, personal computers, Internet communications and networking, and others. Further, system 400 may be provided on a single board, on multiple boards, or within multiple enclosures.

System 400 includes a processing unit 402, a memory unit 404 and an I/O unit 406 interconnected together by one or more buses. According to this exemplary embodiment, a programmable logic device (PLD) 408 is embedded in processing unit 402. PLD 408 may serve many different functions within the system in FIG. 2. PLD 408 can, for example, be a logical building block of processing unit 402, supporting its internal and external operations. PLD 408 is programmed to implement the logical functions necessary to carry out its particular role in system operation. PLD 408 may be coupled to memory 404 through connection 410 and to I/O unit 406 through connection 412.

Processing unit 402 may direct data to an appropriate system component for processing or storage, execute a program stored in memory 404 or receive and transmit data via I/O unit 406, or other similar function. Processing unit 402 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLD 408 can control the logical operations of the system. In an embodiment, PLD 408 acts as a reconfigurable processor, which can be reprogrammed as needed to handle a particular computing task. Alternately, programmable logic device 408 may itself include an embedded microprocessor. Memory unit 404 may be a random access memory (RAM), read only memory (ROM), fixed or flexible disk media, PC Card flash disk memory, tape, or any other storage means, or any combination of these storage means.

Figure 5:
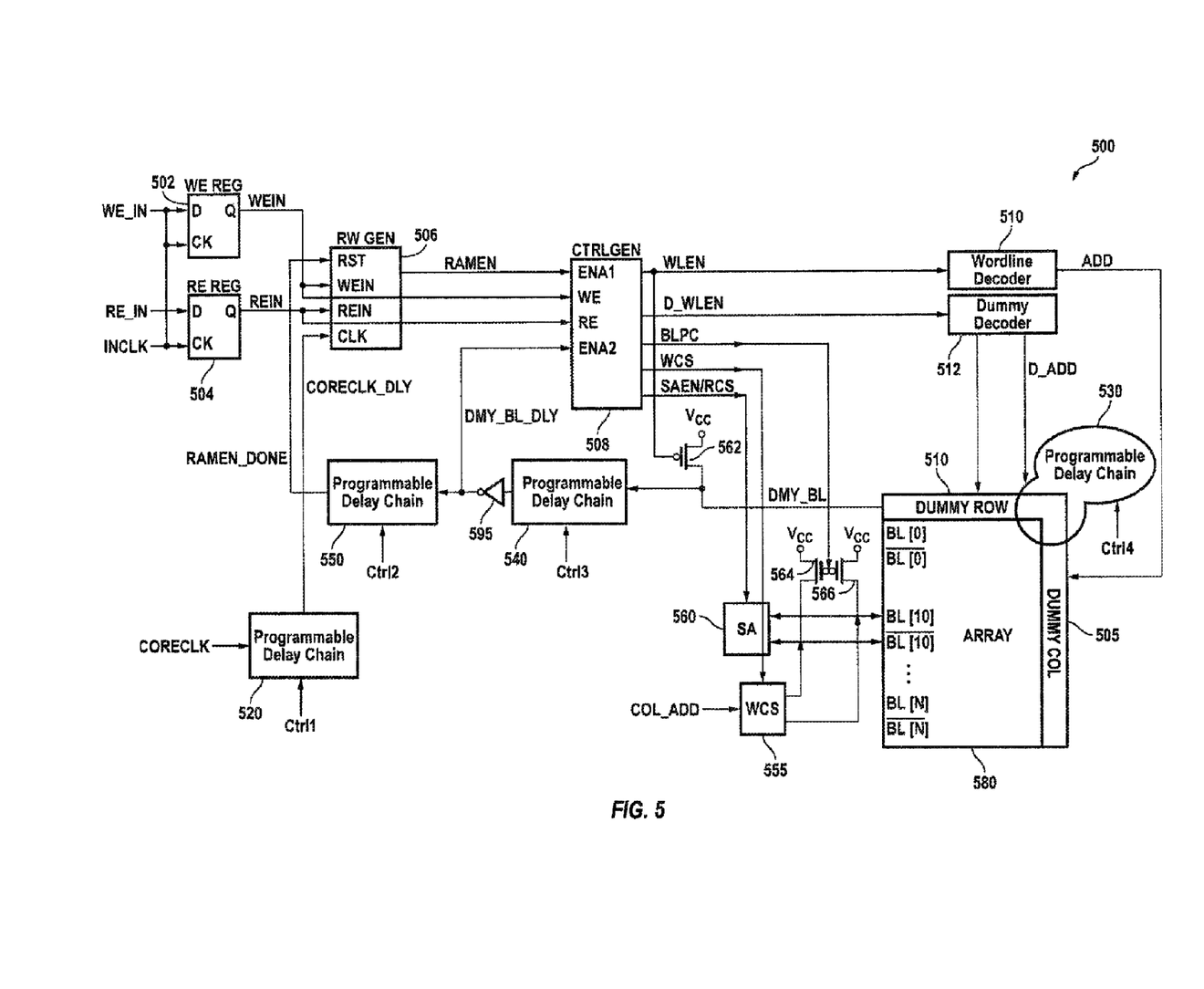
FIG. 5 is a schematic diagram of a number of blocks of a dual-port SRAM cell array, in accordance with one embodiment of the present invention.

FIG. 5 is a schematic diagram of a number of blocks of a dual-port SRAM 500, in accordance with one embodiment of the present invention. As described further below, all memory access operations, i.e., read, write, and read-then-write, are triggered by a read/write enabling RAMEN, which in turn, is asserted when a request to perform a read operation via signal RE_IN, a write operation via signal WE_IN, or a read-then-write operation via both signals RE_IN and WE_IN, is made. Triggering of signal RAMEN is performed using a pair of clock signals INCLK and CORECLK. The phase shift between these two clock signals is critical to the proper operation of SRAM 500. If the relative phase shift between these two clock signals is greater than the upper bound of a window, the performance of SRAM 500 may be degraded. If, on the other hand, the relative phase shift between these two clock signals is smaller than the lower bound of the window, SRAM 500 may not operate properly and read/write functional failures may result. To ensure that the phase shift, also referred to as the timing margin, between clocks INCLK and CORECLK remains within an optimum window, in accordance with the present invention, a chain of programmable delay elements 520 is disposed in SRAM 500. Control signal Ctrl1 is used to vary the amount of delay that is introduced in signal CORECLK before the delayed replica of this signal CORECLK_DLY is applied to the clock input terminal of signal generation block 506.

Dummy bitlines, mimicking the actual bitlines of a memory array, are used to turn on the sense amplifiers that sense the voltage differentials developed across true and complementary bitlines. In accordance with the present invention, two chains of programmable delay elements 530 and 540 are used to control the timing response of the dummy bitlines or the signals associated with the dummy bit lines to the dummy wordline select signals. Programmable delay chain 530 is used for fine adjustments of delays, whereas programmable delay chain 540 is used for coarse adjustments of delays. An additional chain of programmable delay elements 550, disposed between programmable delay chain 540 and signal generator 506, controls the timing of the signal RESET that resets the signals generated by signal generator 506. The operation of the various blocks of SRAM 500 is described further below.

Registers 502 and 504 respectively receive the write request and read request signals WE_IN and RE_IN, and store these signals on the rising (or falling) edge of signal INCLK. The output signals of registers 502 and 504 are respectively shown as WE_IN and RE_IN. Signal generation block 506 asserts control signal RAMEN if either or both of the output signals of registers 502 and 504 are at high levels and in response to signal CORECLK_DLY. In other words, signal RAMEN is asserted if a request is made to perform any one of the read, write, or read-then-write operations in response to clock signal CORECLK. The delay between clock signals CORECLK_DLY and CORECLK can be adjusted by programming the number of delay elements disposed in the delay chain 520 to satisfy the setup and hold times required by signal generation block 506.

Control block 508 receives signal RAMEN, the output signals of registers 502 and 504, as well as a feedback signal ENA2, and in response, generates signals WLEN, D_WLEN, BLPC, WCS and SAEN/RCS. Signal WLEN and D_WLEN are used, respectively, to select the wordlines of the regular and dummy memory cells. Signal BLPC precharges the bitlines to a predetermined value Vcc prior to any memory access operation. Signal WCS is used to select a column during write cycles. Signal SAEN/RCS is used to select a column during a read cycle and to enable the sense amplifiers to sense the bitlines during such a cycle.

Signal WLEN is applied to wordline decoder 510, which in response selects one of the wordlines for the required memory access operation in array 580 via signal ADD. Similarly, signal D_WLEN is applied to dummy wordline decoder 512, which in response selects one of the dummy wordlines mimicking the wordline selected by wordline decoder 510. Signals COL_ADD and WCS are applied to write column select block WCS 555 to select one of the bitline pairs during a memory access operation.

Transistor 562 is used to precharge the dummy bitlines, and transistors 564 and 566 are used to precharge the regular bitlines of the SRAM cells disposed in array 580. Prior to any memory access operations, signal BLPC is at a low level to keep PMOS transistors 564 and 566 on, thereby allowing the bitlines to be precharged to the supply voltage Vcc. Similarly, when signal D_WLEN is at a low level, PMOS transistor 562 is on to enable the dummy bitline to be precharged to the Vcc supply voltage. Sense amplifier block 560 includes a multitude of sense amplifiers that sense the selected bitline voltage differentials to supply the addresses data. The various operations of SRAM block 500 are described further below with reference to FIGS. 6-8.

Figure 6:
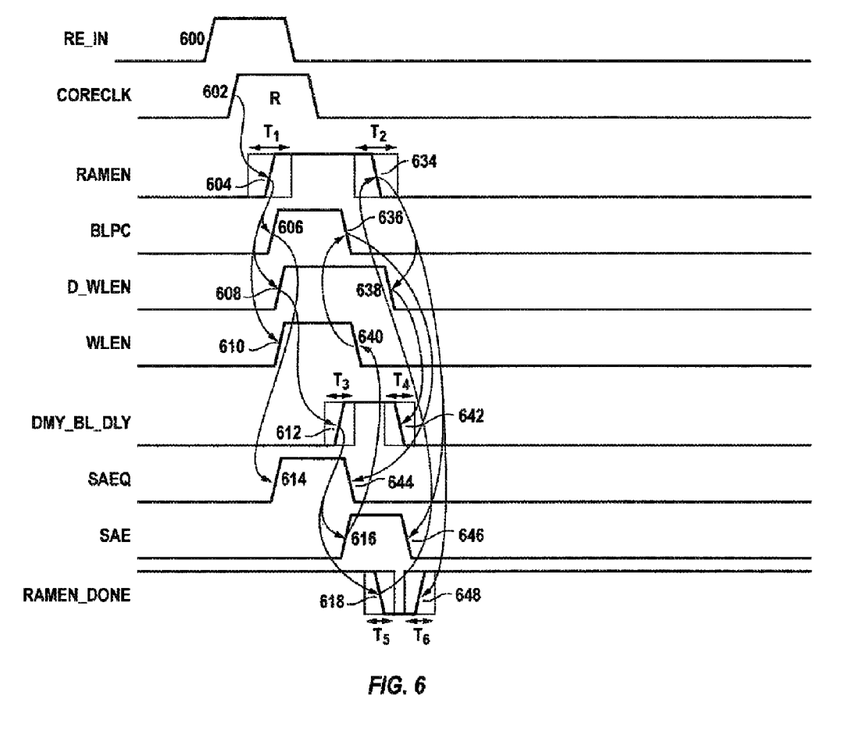
FIG. 6 is an exemplary timing diagram of various signals associated with a read operation of a dual-port SRAM, in accordance with on embodiment of the present invention.

FIG. 6 is an exemplary timing diagram of various signals associated with a read operation of SRAM 500. Concurrent references to FIGS. 5 and 6 are made below. In response to the rising edges (transitions) 600 and 602 of signals RE_IN and CORECLK, respectively, a read request command is issued. In response to the rising edge of signal CORECLK, signal RAMEN is asserted by making a low-to-high transition 604. Transition 604 causes signal BPLC to make a low-to-high transition 606 thereby to terminate the bitline precharge operation. Transition 604 also causes transition 608 and 610 to occur on signals D_WLEN, and WLEN, respectively, to enable decoders 510 and 512 to decode addresses. Transition 608 of signal D_WLEN also terminates the dummy bitline precharge operation, as described above. Signals BPLC, D_WLEN and WLEN form the first set of command signals associated with a read operation.

Transition 606 of signal BLPC causes signal SAEQ to make a low-to-high transition 614 in order to terminate the precharging of the sense lines (no shown) coupled to the sense amplifiers. Transition 608 of signal D_WLEN causes the selected dummy bitline to respond to the value stored in the selected dummy SRAM cells, thereby causing signal DMY_BL (not shown in FIG. 6) and its delayed replica DMY_BL_DLY to make a low-to-high transition 612 in this exemplary timing diagram. Transition 612 of signal DMY_BL_DLY triggers a transition 616 on signal SAE thus turning on the sense amplifier 560 to sense the voltage differentials developed across the true and complementary bitlines (not shown in FIG. 6) of the selected SRAM cell to enable the read operation to be carried out. In response to transition 612 of signal DMY_BL_DLY, signal RAMEN_DONE which is a delayed and inverted replica of signal DMY_BL_DLY, makes transitions 618. Signals SAEQ and SAE form the second set of signals associated with a read operation.

As stated above, in accordance with the present invention, transition 604 of signal RAMEN may be varied within the time window T1 using programmable delay chain 520. Similarly, in accordance with the present invention, transition 612 of signals DMY_BL_DLY may be varied within the time window T3 using programmable delay chains 530 and 540; and transition 618 of signal RAMEN_DONE, may be varied within time window T5 using programmable delay chain 550. Similarly transitions 634 and 648 may be varied within the time windows T2, and T6, respectively, in accordance with the delays programmed in programmable delay chains 520 and 550. Similarly transition 642 may be varied within the time window T4 in accordance with the delays programmed in programmable delay chains 530 and 540. As described above and shown in FIG. 6, signal RAM_EN is used to generate the first set of command signals BPLC, WLEN and D_WLEN associated with the read operation, which are in turn used to generate signal DM_BL_DLY. Likewise, signal DM_BL_DLY is used to generate signal SAE that is a part of the second set of command signals associated with the read operation. Therefore, in accordance with the present invention, by varying, in part, the delay associated with signal DM_BL_DLY via programmable delay chains 530 and 540, the timing delay between the first and second set of command signals used to perform a read operation is controllably adjusted to improve performance.

Transition 618 of signal RAMEN_DONE causes signal RAMEN to make a low-to-high transition 634 thereby to reset signal RAMEN. The resetting of signal RAMEN, in turn, causes signal D_WLEN to make a transition 638, in response to which dummy bit line DMY_BL and its delayed replica DMY_BL_DLY are precharged via transistor 162, shown as high-to-low transition 642. Following the elapse of a time after transition 616 of signal SAE, signal WLEN makes a high-to-low transition 640 to terminate the wordline decoding, and signal BLPC makes a high-to-low transition 636 to enable the bitlines to be precharged in preparation for the next memory access operation. Transition 636 of signal BLPC causes signal SAEQ to make a high-to-low transition 644 to start the precharging of the sense lines in preparation for the next memory read operation. The resetting of signal RAMEN also causes signal SAE to make a high-to-low transition 646 to disable the sensing operation. Signal RAMEN_DONE makes a low-to-high transition 648 in response to the low-to-high transition 642 of signal DMY_BL_DLY. Signal RAMEN_DONE is used to transfer the data read by the sense amplifiers to output ports. Therefore, the timing between turning on of the sense amplifiers via SAE and transferring the data retrieved from the sense amplifiers is critical. In accordance with the present invention, by controlling the timing of signal RAMEN_DONE via programmable delay chain 550, it is ensured that the data retrieved from the sense amplifiers is transferred out before the sense amplifiers are turned off.

Signals WEIN, REIN and CORECLK_DLY are collectively used to generate signal RAMEN. Assume for example, that the bitlines are charged to 70% of the full Vcc level when a read or write operation is about to take place. In the absence of programmable delay chain 520, the requested read or write operation will proceed with the partially charged (70%) bitlines, which is undesirable. However, in accordance with the present invention, by delaying signal CORECLK_DLY via programmable delay chain 520, signal RAMEN is also delayed to enable the bitlines to be charged to a desirable value representing, for example, 95% of the full Vcc level. Other advantages are also achieved by controlling the delay of signal CORECLK-DLY via programmable delay chain 520.

Figure 7:
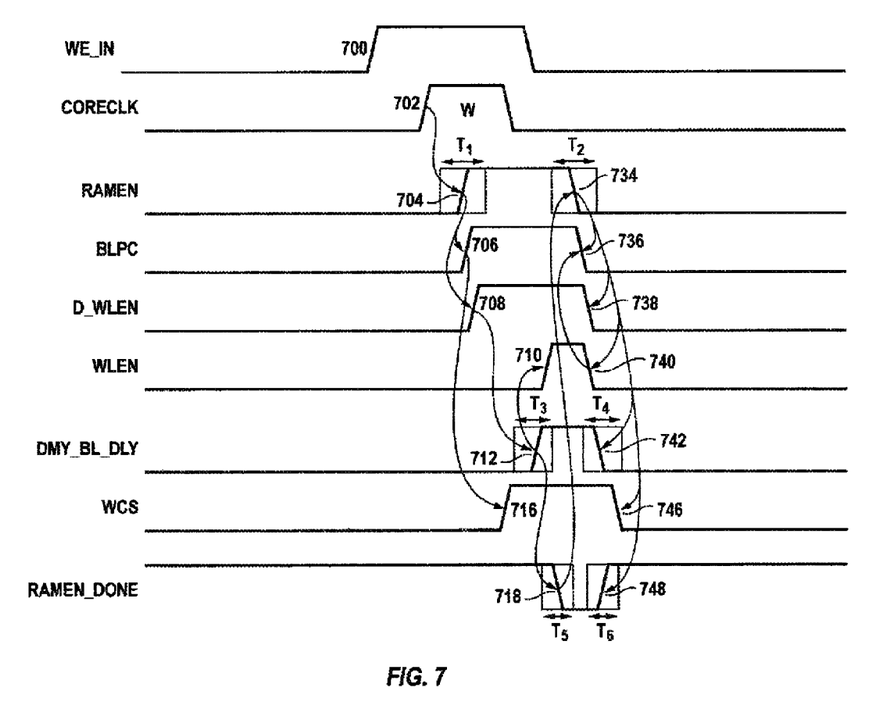
FIG. 7 is an exemplary timing diagram of various signals associated with a write operation of a dual-port SRAM, in accordance with on embodiment of the present invention.

FIG. 7 is an exemplary timing diagram of various signals associated with a write operation of SRAM 500. Concurrent references to FIGS. 5 and 7 are made below. In response to transitions 700 and 702 of signals WE_IN and CORECLK, a write request command is issued. In response to the rising edge of signal CORECLK, signal RAMEN is asserted by making a low-to-high transition 704. Transition 704 causes signal BPLC to make a high-to-low transition 706 in order to terminate the bitline precharge operation. Transition 704 also causes signal D_WLEN to make a low-to-high transition 708 to enable address decoding by decoders 512 and to terminate the dummy bitline precharge operation. Transition 704 also causes signal WCS to make a low-to-high transition 716 in order to connect the bitlines to the input lines supplying the data for the write operation to be completed. (see FIG. 1). Signals BPLC, D_WLEN and WCS (write column select) form the first set of command signals associated with a write operation.

The dummy address decoded in response to low-to-high transition 708 of signal D_WLEN causes signal DMY_BL_DLY which is a delayed replica of signal DMY_BL to make a low-to-high transition 712. Transition 712 of signal DMY_BL_DLY triggers a low-to-high transition 710 on signal WLEN and the high-to-low transition 718 on signal RAMEN_DONE. In other words, during a write cycle, the dummy bitlines trigger signal WLEN, which in turn, is used to decode the correct wordline. Accordingly, during the write cycles, the transitions on the dummy bit lines are used to control the timing margin between the supply of the input data and enabling of the decoded wordline. Because the delay associated with signal DMY_BL_DLY is programmable, the setup time and hold time of the input data relative to selection of the decoded wordline address may be varied. This timing margin may be optionally narrowed to speed up the write cycle to increase performance when possible. The timing margin may also be optionally widened to correct read/write functional failures or otherwise increase yield. Following transition 710 on signal WLEN, the cells positioned at the selected address store the data supplied on the input data lines to complete the write cycle. The low-to-high transition 712 of signal DMY_BL_DLY cause signal RAMEN_DONE to make a high-to-low transition 718 in accordance with the delay time programmed in programmable delay chain 550 to reset the signals in signal generator 506. Signal WLEN forms the first set of command signal associated with a write operation.

The high-to-low transition 718 of signal RAMEN_DONE causes signal RAMEN to be reset as shown in transition 734. Transition 734 causes signals D_WLEN, WLEN to go low with transitions 738 and 740, respectively, to disable the decoding of the regular and dummy wordlines. Transition 740, in turn, causes signal BPLC to make a high-to-low transition 736 to start the bitline precharge process. In response to transition 734, signal DMY_BL_DLY makes a high-to-low transition 742. Transition 734 also causes signal WCS to make a high-to-low transition 746 to terminate the connection between the bitlines and the signal lines carrying input data. Transition 734 also causes signal RAMEN_DONE to make a low-to-high transition 748.

As stated above, in accordance with the present invention, transition 704 of signal RAMEN may be varied within the time window T1 using programmable delay chain 520.

Similarly, in accordance with the present invention, transition 712 of signals DMY_BL_DLY may be varied within the time window T3 using programmable delay chains 530 and 540; and transition 718 of signal RAMEN_DONE, may be varied within time window T5 using programmable delay chain 550. Similarly transitions 734 and 748 may be varied within the time windows T2, and T6, respectively, in accordance with the delays programmed in programmable delay chains 520 and 550. Similarly transition 742 may be varied within the time window T4 in accordance with the delays programmed in programmable delay chains 530 and 540. As described above and shown in FIG. 7, signal RAM_EN is used to generate the first set of command signals BPLC, WCS and D_WLEN associated with the write operation, which are in turn used to generate signal DM_BL_DLY. Likewise, signal DM_BL_DLY is used to generate signal WLEN that forms the second set of command signal associated with the write operation. Therefore, in accordance with the present invention, by varying, in part, the delay associated with signal DM_BL_DLY via programmable delay chains 530 and 540, the timing delay between the first and second set of command signals used to perform a write operation is controllably adjusted to improve performance.

Figure 8:
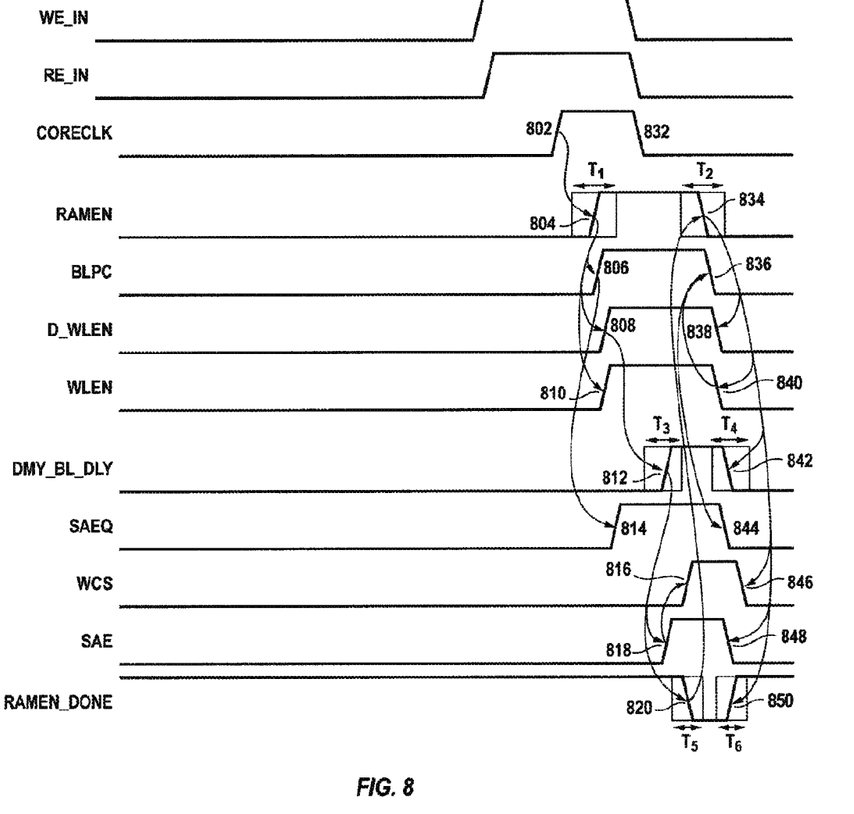
FIG. 8 is an exemplary timing diagram of various signals associated with a read-then-write operation of a dual-port SRAM, in accordance with on embodiment of the present invention.

FIG. 8 is an exemplary timing diagram of various signals associated with a read-then-write operation of SRAM 500. Concurrent references to FIGS. 8 and 5 are made below. In response to the low-to-high transitions of signals RE_IN, WE_IN, and low-to-high transition 802 of signal CORECLK, a read-then-write request command is issued, thereby causing signal RAMEN to be asserted by making a low-to-high transition 804. Transition 804 causes signal BPLC to make a low-to-high transition 806 to terminate the bitline precharge operation. Transition 804 also causes signals D_WLEN and WLEN to make low-to-high transitions 808 and 810, respectively, to enable address decoding by decoders 510 and 512. Transition 808 of signal D_WLEN also terminates the dummy bitline precharge operation.

Transition 806 of signal BLPC causes signal SAEQ to make a low-to-high transition 814 in order to terminate the precharging of the sense lines (not shown) coupled to the sense amplifiers. Transition 808 of signal D_WLEN causes the selected dummy bitline to respond to the value stored in the selected dummy SRAM cell thereby causing signal DMY_BL and its delayed replica DMY_BL_DLY to make a low-to-high transition 812. Transition 812 of signal DMY_BL_DLY triggers a transition 818 on signal SAE thus turning on the sense amplifier 560 to sense the voltage differential developed across the selected true and complementary bitlines of the SRAM cell, thereby to complete the read operation. In response to transition 812 of signal DMY_BL_DLY, signal RAMEN_DONE which is a delayed and inverted replica of signal DMY_BL_DLY, makes a high-to-low transition 820. Transition 818 causes signal WCS to make a low-to-high transition 816 in order to connect the bitlines to the input lines supplying the data for the completion of the write operation. (see FIG. 1).

The low-to-high transition 812 of signal DMY_BL_DLY causes signal RAMEN_DONE to make a high-to-low transition 820, in accordance with the delay time programmed in programmable delay chain 550, to reset the signals in signal generator 506. The high-to-low transition 820 of signal RAMEN_DONE causes signal RAMEN to be reset by making a high-to-low transition 834. Transition 834 causes signals D_WLEN, and WLEN to go low with transitions 838 and 840, respectively, to disable the decoding of the regular and dummy wordlines. Transition 840, in turn, causes signal BPLC to make a high-to-low transition 836 to start the bitline precharge process. In response to transition 834, signal DMY_ BL_DLY makes a high-to-low transition 842. Transition 834 also causes signal WCS to make a high-to-low transition 846 to terminate the connection between the bitlines and the signal lines carrying input data. Transition 834 also causes signal RAMEN_DONE to make a low-to-high transition 850. Signals BPLC, D_WLEN and WLEN form the first set of command signals associated with a read-then write operation. Signals SAEQ and SAE form the second set of command signals associated with a read-then write operation. Signal WCS forms the third set of command signal associated with a read-then write operation. As described above and shown in FIG. 7, signal RAM_EN is used to generate the first set of command signals BPLC, WLEN and D_WLEN associated with the read-then-write operation, which are in turn used to generate signal DM_BL_DLY. Likewise, signal DM_BL_DLY is used to generate signals SAEQ and SAE that form the second set of command signal associated with the write operation. Signal SAE, in turn, is used to form the third set of command signal associated with a read-then write operation. Therefore, in accordance with the present invention, by varying, in part, the delay associated with signal DM_BL_DLY via programmable delay chains 530 and 540, the timing delay between the first, second and third command signals used to perform a read-then-write operation is controllably adjusted to improve performance.

As stated above, in accordance with the present invention, transition 804 of signal RAMEN may be varied within the time window T1 using programmable delay chain 520. Similarly, in accordance with the present invention, transition 812 of signals DMY_BL_DLY may be varied within the time window T3 using programmable delay chains 530 and 540; and transition 820 of signal RAMEN_DONE, may be varied within time window T5 using programmable delay chain 550. Similarly transitions 834 and 850 may be varied within the time windows T2, and T6, respectively, in accordance with the delays programmed in programmable delay chains 520 and 550. Similarly transition 842 may be varied within the time window T4 in accordance with the delays programmed in programmable delay chains 530 and 540.

The adjustment of the timing of the various signals described above may be carried out either before the mask sets used during manufacturing of the FPGA is generated or after the wafers containing the FPGAs have been fabricated. Assume, for example, that computer simulation incorporating various parasitic capacitances, resistors, etc., extracted from the FPGA layout, indicates that the timing margins between the signals described above are not optimum. Accordingly, because the FPGA of the present invention includes a multitude of programmable delay chains disposed between various signals paths, by programming one or more of these delay chains, the timing margins may be varied to achieve, for example, performance improvement or otherwise to rectify functionality. The programmable delay chains may also be used to adjust the timing margin of the signals on the silicon die containing the FPGA. By varying the control signals, such as CTRL1-CTRL4, while the FPGA is being programmed to perform the desired functions, the timing margins are adjusted, for example, to minimize read and/or write functional failures, or improve the memory performance by speeding up the programmable control paths.

Therefore, in accordance with the present invention, the yield may be increased and the read/write functional failures may be minimized. Also, failures caused by the timing margin variations may be repaired on the silicon die. Moreover, tuning—either a decrease or increase—of the memory speed may be carried out on the silicon. Consequently, the present invention increases reliability and robustness of the design. Furthermore, the bandwidth of memory testability may be increased thus enabling collection of more information on soft errors. Also, by adjusting the timing margins, in accordance with the present invention, correlation between the mathematical models enabling computer simulation and the data collected from the silicon die is improved.

Figure 9:
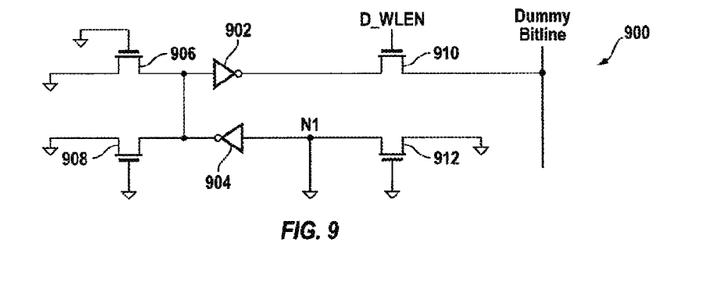
FIG. 9 is a schematic diagram of a dummy SRAM cell used in the dual-port SRAM of the present invention.

FIG. 9 is a schematic diagram of a dummy SRAM cell 900 used in dummy row 510 and dummy column 505 of array 580 shown in FIG. 5, in accordance with one embodiment of the present invention. Dummy SRAM cell 900 is shown as including inverters 902, 904 and NMOS transistors 904, 908, 910 and 912. Node N1 coupled to the input terminal of inverter 904 is connected to the ground potential. Gate terminals of transistors 906, 908 and 912 are also connected to the ground potential. Accordingly, when signal D_WLEN is raised to a high voltage, the dummy bitline receives a high voltage present at the output terminal of inverter 910.

The above embodiments of the present invention are illustrative and not limitative. For example, the invention is not limited by the type or the number of delay elements disposed in each of the programmable delay chains. For example, in some embodiments, a different programmable delay chain may control the delay associated with each signal. Therefore, in such embodiments, the delay associated with each signal may be separately varied. The invention is not limited by the type of the technology, CMOS, Bipolar, BICMOS or otherwise that may be used to from the universal connector. The invention is not limited by the type of integrated circuit in which the universal connector is disposed. For example, the present invention, may be disposed in a programmable logic device, a SoC or any other IC which may require configurability. Nor is the invention limited by the type memory array, static, dynamic or otherwise, that may use the present invention. Other additions, subtractions or modification are obvious in view of the present invention and are intended to fall within the scope of the appended claims.

What is claimed is:

1. A method of operating a circuit, the method comprising:
   determining a target phase shift between a first clock signal and a second clock signal;
   delaying the second clock signal relative to the first clock signal based on the target phase shift; and
   triggering a memory access operation using the first clock signal and the second clock signal.

2. The method of claim 1, wherein the determining comprises setting the target phase shift to a value greater than specified lower bound and less than a specified upper bound.

3. The method of claim 1, wherein the delaying comprises setting at least one value of at least one programmable delay chain.

4. The method of claim 3, wherein setting the at least one value of the at least one programmable delay chain comprises:
   setting a value of a first programmable delay chain, the first programmable delay chain controlling a fine delay amount; and
   setting a value of a second programmable delay chain, the second programmable delay chain controlling a coarse delay amount.

5. The method of claim 1, wherein the memory access operation is a read-then-write operation.

6. The method of claim 1, wherein the circuit is an FPGA.

7. The method of claim 1, wherein the circuit is a static random access memory.

8. An integrated circuit comprising:
   delay circuitry configured to:
      determine a target phase shift between a first clock signal and a second clock signal; and
      delay the second clock signal relative to the first clock signal based on the target phase shift; and
   control circuitry configured to initiate a memory access operation using the first clock signal and the second clock signal.

9. The integrated circuit of claim 8, wherein the delay circuitry is further configured to set the target phase shift to a value greater than specified lower bound and less than a specified upper bound.

10. The integrated circuit of claim 8, wherein the delay circuitry is further configured to delay the second clock signal by setting at least one parameter of a programmable delay chain.

11. The integrated circuit of claim 10, wherein the delay circuitry is further configured to set the at least one parameter of the programmable delay chain by:
    setting a first parameter of the programmable delay chain based on a target fine delay amount; and
    setting a second parameter of the programmable delay chain based on a target coarse delay amount.

12. The integrated circuit of claim 8, wherein the memory access operation is a read-then-write operation.

13. The integrated circuit of claim 8, wherein the integrated circuit is an FPGA.

14. The integrated circuit of claim 8, wherein the integrated circuit is a static random access memory.

15. An integrated circuit comprising:
    delay circuitry configured to delay a first clock signal relative to a second clock signal based on a target phase shift; and
    control circuitry configured to perform a memory access operation based on the first clock signal and the second clock signal.

16. The integrated circuit of claim 15, wherein the delay circuitry is further configured to set the target phase shift to a value greater than specified lower bound and less than a specified upper bound.

17. The integrated circuit of claim 15, wherein the delay circuitry is further configured to set the delay using a first delay element, to set a fine adjustment to the delay, and a second delay element, to set a coarse adjustment to the delay.

18. The integrated circuit of claim 15, wherein the memory access operation is a read-then-write operation.

19. The integrated circuit of claim 15, wherein the integrated circuit is an FPGA.

20. The integrated circuit of claim 15, wherein the integrated circuit is a static random access memory.

* * * * *